(12) United States Patent
Mosur et al.

(10) Patent No.: US 8,373,583 B2
(45) Date of Patent: Feb. 12, 2013

(54) COMPRESSION PRODUCING OUTPUT EXHIBITING COMPRESSION RATIO THAT IS AT LEAST EQUAL TO DESIRED COMPRESSION RATIO

(75) Inventors: Lokpraveen B. Mosur, Gilbert, AZ (US); Sailesh Bissessur, Phoenix, AZ (US); Quinn W. Merrell, Phoenix, AZ (US); Prashant Paliwal, Karnataka (IN); Andrew Milne, Ottawa (CA)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 13/085,295

(22) Filed: Apr. 12, 2011

(65) Prior Publication Data

US 2012/0262312 A1 Oct. 18, 2012

(51) Int. Cl.
*H03M 7/34* (2006.01)
(52) U.S. Cl. ...................... 341/51; 375/240.23
(58) Field of Classification Search ............. 341/51, 341/59; 375/240.01, 240.02, 240.03, 240.12, 375/240.15, 240.23; 382/238, 240, 244, 382/245; 348/390, 404, 405
See application file for complete search history.

(56) References Cited

U.S. PATENT DOCUMENTS 7,154,416 B1  12/2006  Savage
2008/0089424 A1*  4/2008  Karczewicz et al. .... 375/240.23

OTHER PUBLICATIONS

"Huffman Coding." Wikipedia. Accessed Feb. 3, 2011. 9 pages.
Mcintyre, David R. et al. "Data Compression Using Static Huffman Code-Decode Tables." Computing Practices. Communications of the ACM. Jun. 1985. vol. 28, No. 6. 5 pages.
Postel, J. "User Datagram Protocol." RFC 768. USC/Information Sciences Institute. Aug. 28, 1980. 3 pages.
Deutsch, P. "DEFLATE Compressed Data Format Specification version 1.3." Network Working Group. RFC 1951. Aladdin Enterprises. May 1996. 15 pages.
Ziv, Jacob et al. "A Universal Algorithm for Sequential Data Compression." IEEE Transactions on Information Theory. vol. IT-23. No. 3. May 1977. 7 pages.
Huffman, David A. "A Method for the Construction of Minimum-Redundancy Codes." Proceedings of the I.R.E. Sep. 1952. 4 pages.

* cited by examiner

*Primary Examiner* — Joseph Lauture
(74) *Attorney, Agent, or Firm* — Christopher K. Gagne

(57) ABSTRACT

An embodiment may include first circuitry and second circuitry. The first circuitry may compress, at least in part, based at least in part upon a first set of statistics, input to produce first output exhibiting a first compression ratio. If the first compression ratio is less than a desired compression ratio, the second circuitry may compress, at least in part, based at least in part upon a second set of statistics, the first output to produce second output. The first set of statistics may be based, at least in part, after an initial compression, upon other data that has been previously compressed and is associated, at least in part, with the input. The second set of statistics may be based at least in part upon the input. Many alternatives, variations, and modifications are possible.

20 Claims, 3 Drawing Sheets

US 8,373,583 B2

COMPRESSION PRODUCING OUTPUT EXHIBITING COMPRESSION RATIO THAT IS AT LEAST EQUAL TO DESIRED COMPRESSION RATIO

FIELD

This disclosure relates to compression to produce output that exhibits a compression ratio that is greater than or equal to a desired compression ratio.

BACKGROUND

In a conventional non-adaptive Huffman compression technique, the data block that is desired to undergo compression is analyzed, in a first pass, to determine symbol frequencies, and Huffman code is generated, based upon the determined symbol frequencies, in a second pass. Generating the Huffman code based upon the symbol frequencies determined from analysis the particular data block undergoing compression may be referred to as dynamic coding, in contradistinction to static coding based upon preselected symbol frequencies. The data block also is processed to substitute symbols into variable length prefix codes. This conventional technique typically is difficult and costly to implement using conventional embedded hardware, since significant on-chip memory and/or relatively high processing throughput constraints may exist for and/or be imposed upon such hardware. Also, in this conventional technique, additional latency results from executing the second pass. In at least some situations and/or applications, this may increase the amount of storage utilized to an undesirable level, may decrease resulting system performance to a level that is unacceptable from a user standpoint, and/or may make it difficult to achieve desired quality of service and/or other parameters. Additionally, if a single static code is employed instead of dynamic code, the resulting compression ratio may be significantly less (e.g., on average, between five and twenty percent less), depending upon the particular type of data being compressed, than it may have been if dynamic code were employed.

One proposed solution involves the use of four static trees, in addition to those typically employed, that may be thought to provide desirable compression ratios for at least certain types of data. In this proposed solution, the resultant compressed file includes an identification code that determines which types of codes were employed in the compression. The decompression algorithm then employs the identification code to determine how to decompress the compressed file. Inasmuch as the code trees used to compress the data are not themselves transmitted with the compressed file, in order to be able to decompress the compressed file, the particular trees that correspond to the identification codes are pre-programmed into the decompression algorithm. As can be readily appreciated, unless the decompression algorithm is pre-programmed with the trees and which identification codes represent which trees, the decompression algorithm cannot decompress the compressed file. This results in significant disadvantages, such as, the difficulty to use and/or adapt this technique for use with currently existing applications.

BRIEF DESCRIPTION OF THE SEVERAL VIEWS OF THE DRAWINGS

Features and advantages of embodiments will become apparent as the following Detailed Description proceeds, and upon reference to the Drawings, wherein like numerals depict like parts, and in which.

Although the following Detailed Description will proceed with reference being made to illustrative embodiments, many alternatives, modifications, and variations thereof will be apparent to those skilled in the art. Accordingly, it is intended that the claimed subject matter be viewed broadly.

DETAILED DESCRIPTION

Figure 1:
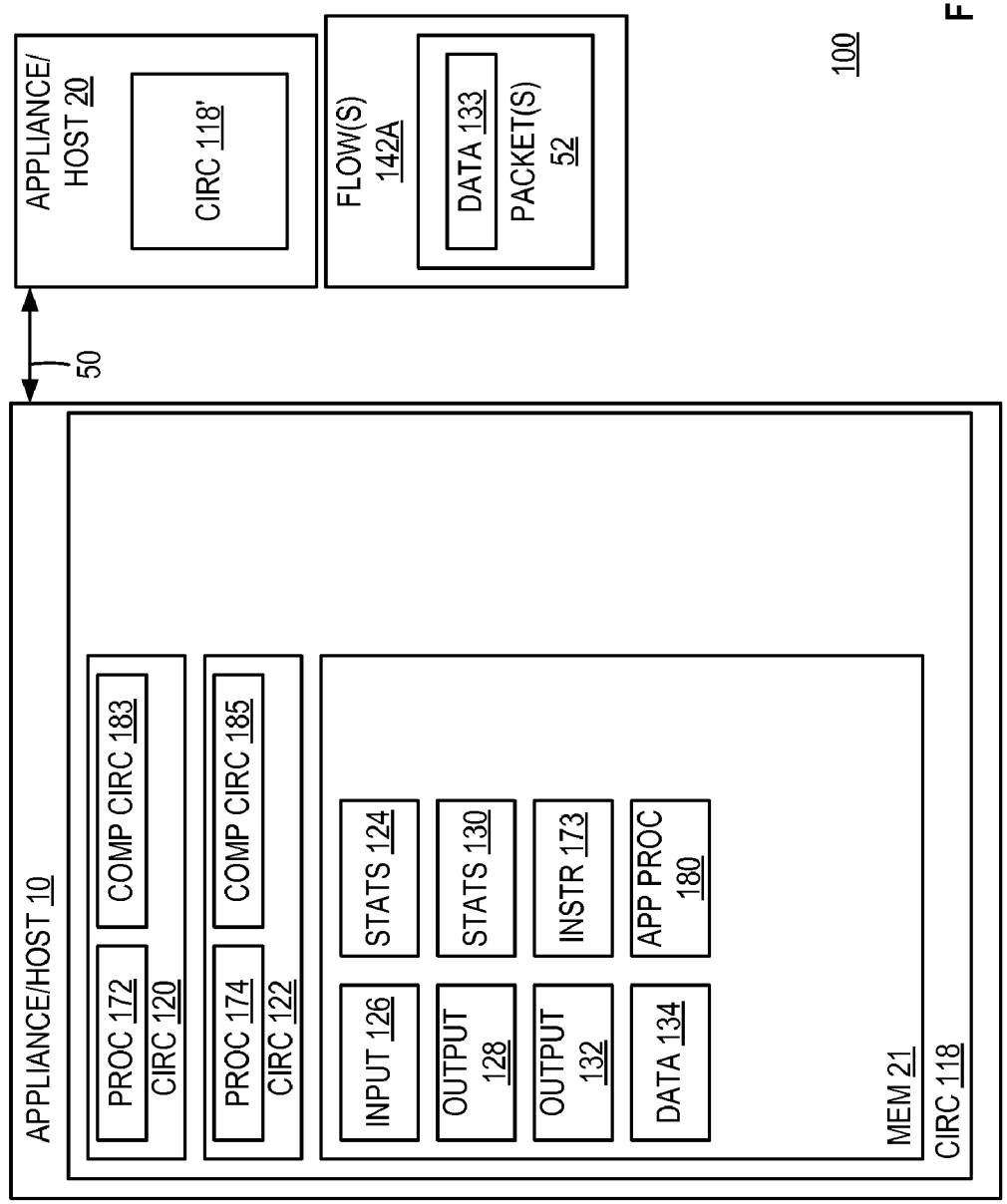
FIG. 1 illustrates a system embodiment.

FIG. 1 illustrates a system embodiment 100. System 100 may include one or more appliances and/or hosts 10 and one or more remote appliances and/or hosts 20 that may be communicatively coupled together via one or more wireless and/or wired networks 50. In this embodiment, a host, server, appliance, client, and/or node may be or comprise, for example, one or more end stations, smart phones, hand held devices, personal data assistant devices, tablets, computer systems, appliances, intermediate stations, network interfaces, clients, servers, other devices, and/or portions thereof. In this embodiment, a "network" may be or comprise any mechanism, instrumentality, modality, and/or portion thereof that permits, facilitates, and/or allows, at least in part, two or more entities to be communicatively coupled together. Also in this embodiment, a first entity may be "communicatively coupled" to a second entity if the first entity is capable of transmitting to and/or receiving from the second entity one or more commands and/or data. In this embodiment, a "wireless network" means a network that permits, at least in part, at least two entities to be wirelessly communicatively coupled, at least in part. In this embodiment, a "wired network" means a network that permits, at least in part, at least two entities to be communicatively coupled, at least in part, via non-wireless means, at least in part. In this embodiment, data may be or comprise one or more commands and/or instructions, or vice versa.

One or more appliances 10 may comprise circuitry 118. Circuitry 118 may comprise circuitry 120, circuitry 122, and/or computer-readable/writable memory 21. Circuitry 120 may comprise one or more processors (e.g., one or more general purpose host processors) 172 and/or one or more special purpose compression circuitry 183. Circuitry 122 may comprise one or more processors (e.g., one or more general purpose host processors) 174 and/or one or more special purpose compression circuitry 185.

Although not shown in the Figures, circuitry 118, circuitry 120, and/or circuitry 122 may comprise one or more chipsets (and/or other circuitry) that may communicatively couple circuitry 120, circuitry 122, and/or one or more portions thereof (e.g., one or more processors 172, circuitry 183, one or more processors 174, and/or circuitry 185) to each other and/or to memory 21. Also although not shown in the Figures, circuitry 118, circuitry 120, and/or circuitry 122 may comprise network interface controller and/or other circuitry that may permit circuitry 118, circuitry 120, and/or circuitry 122 (and/or one or more portions thereof) to be communicatively coupled to one or more appliances 20 via one or more networks 50. Additionally, some or all of circuitry 118, circuitry 120, circuitry 122, circuitry 183, circuitry 185, the one or more not shown chipsets, memory 21, and/or the functionality and components thereof may be comprised in, for example, one or more host processors 172 and/or 174, or vice versa. Additionally or alternatively, without departing from this embodiment, some or all of circuitry 118, circuitry 120, circuitry 122, circuitry 183, circuitry 185, the one or more not shown chipsets, memory 21, and/or the functionality and components thereof may be comprised in, for example, one or more (not shown) circuit cards that may be coupled to one or more system motherboards (not shown). The one or more system motherboards may comprise one or more host processors 172 and/or 174 and at least a portion of memory 21.

Further alternatively, without departing from this embodiment, special purpose circuitry 183 and/or 185 may be eliminated, at least in part, from circuitry 118, circuitry 120, and/or 122, and the operations described herein as being performed by circuitry 120 and/or 122 may be performed, in whole or in part, by one or more processors 172 and/or 174. Also alternatively, without departing from this embodiment, these operations may be performed, in whole or in part, by circuitry 183 and/or circuitry 185. Yet further alternatively, without departing from this embodiment, circuitry 120 and/or circuitry 122 may not comprise separate portions of circuitry 118, but instead, circuitry 120 may be comprised, at least in part, in circuitry 122, or vice versa. Additionally or alternatively, without departing from this embodiment, circuitry 120, circuitry 122, and/or circuitry 118 may be the same circuitry, at least in part.

In this embodiment, circuitry may comprise, for example, singly or in any combination, analog circuitry, digital circuitry, hardwired circuitry, programmable circuitry, co-processor circuitry, state machine circuitry, and/or memory that may comprise program instructions that may be executed by programmable circuitry. Also in this embodiment, a processor, co-processor, and/or controller may comprise circuitry capable of performing, at least in part, one or more arithmetic and/or logical operations, such as, for example, one or more central processing units. Also in this embodiment, a chipset may comprise circuitry capable of communicatively coupling, at least in part, other circuitry, such as, one or more processors, storage, mass storage, one or more nodes, and/or memory. Although not shown in the Figures, circuitry 118 may comprise a graphical user interface system that may comprise, e.g., a respective keyboard, pointing device, and display system that may permit a human user to input commands to, and monitor the operation of, one or more appliances 10, one or more appliances 20, and/or system 100.

One or more machine-readable program instructions 173 may be stored in computer-readable/writable memory 21. In operation of one or more appliances 10, these instructions 173 may be accessed and executed by circuitry 118, circuitry 120, circuitry 122, and/or one or more components thereof (e.g., one or more processors 172, one or more processors 174, circuitry 183, and/or circuitry 185). When so accessed and executed, this may result, at least in part, in circuitry 118, circuitry 120, circuitry 122, and/or one or more components thereof performing the operations described herein as being performed by circuitry 118, circuitry 120, circuitry 122, and/or one or more components thereof. This may also result, at least in part, in one or more application-level processes 180 being executed by circuitry 118, circuitry 120, circuitry 122, and/or one or more components thereof, and/or in one or more processes 180 being resident in memory 21. In this embodiment, memory 21 may comprise one or more of the following types of memories: semiconductor firmware memory, programmable memory, non-volatile memory, read only memory, electrically programmable memory, random access memory, flash memory, magnetic disk memory, optical disk memory, and/or other or later-developed computer-readable and/or writable memory.

In this embodiment, one or more appliances 20 may comprise circuitry 118'. Circuitry 118' may be or comprise circuitry that may be capable of performing, at least in part, identical, similar, or analogous operations to those that may be performed by circuitry 118. Additionally or alternatively, without departing from this embodiment, circuitry 118' may be capable of performing, at least in part, different and/or additional operations to those that may be performed by circuitry 118, or vice versa.

In this embodiment, one or more appliances 10 and one or more appliances 20 may be geographically remote from each other. One or more appliances 10 and/or one or more circuitry 118 may be capable of exchanging data and/or commands (via one or more networks 50) with one or more appliances 20 and/or circuitry 118' in accordance with one or more protocols. These one or more protocols may be compatible with, e.g., an Ethernet protocol, Transmission Control Protocol/Internet Protocol (TCP/IP), and/or User Datagram Protocol (UDP).

The Ethernet protocol that may be utilized in system 100 may comply or be compatible with the protocol described in Institute of Electrical and Electronics Engineers, Inc. (IEEE) Std. 802.3, 2000 Edition, published on Oct. 20, 2000. The TCP/IP that may be utilized in system 100 may comply or be compatible with the protocols described in Internet Engineering Task Force (IETF) Request For Comments (RFC) 791 and 793, published September 1981. The UDP that may be utilized in system 100 may comply or be compatible with the protocol described in IETF RFC 768, published August 1980. Of course, many different, additional, and/or other protocols may be used for such data and/or command exchange without departing from this embodiment, including for example, later-developed versions of the aforesaid and/or other protocols.

Figure 2:
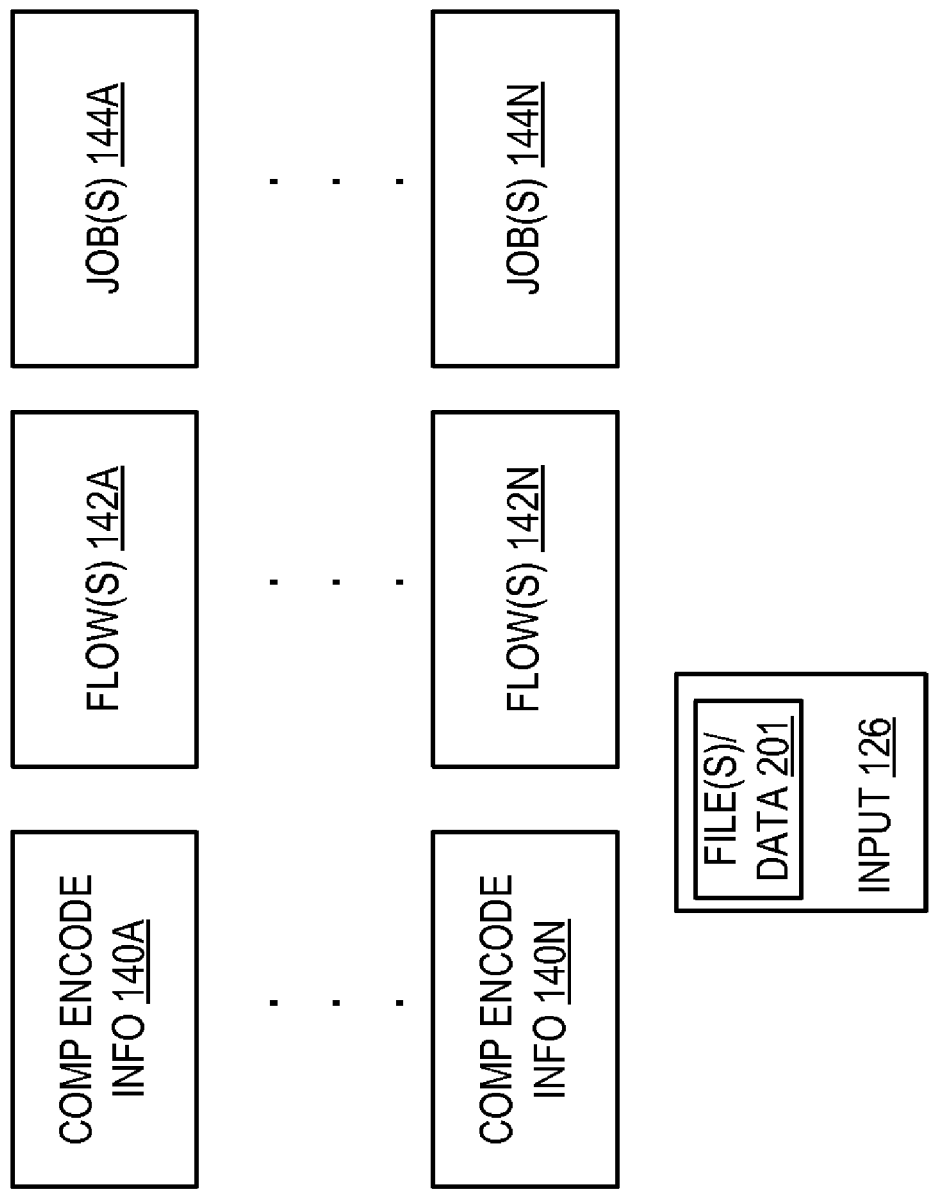
FIG. 2 illustrates features involved in an embodiment.
Figure 3:
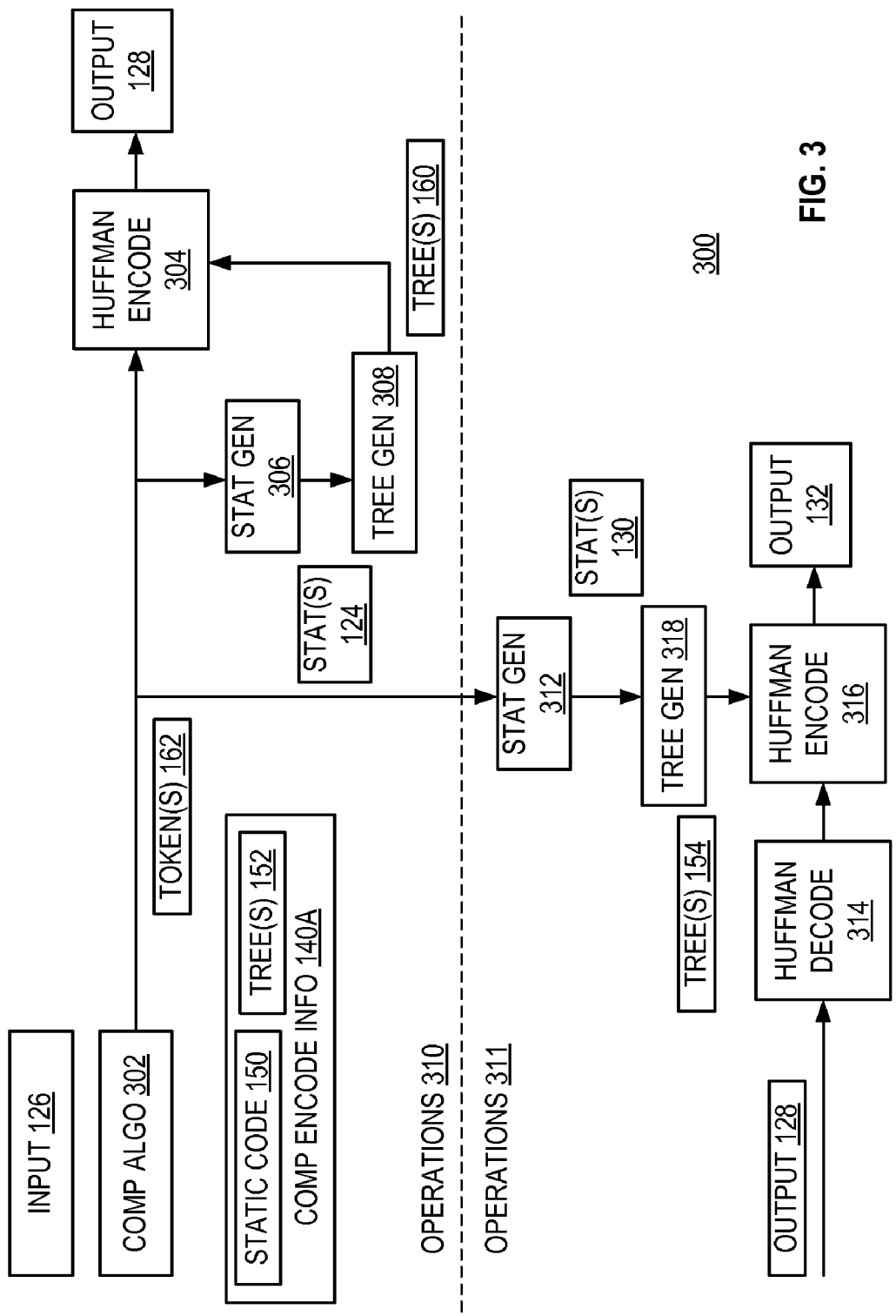
FIG. 3 illustrates operations in an embodiment.

With particular reference now being made to FIGS. 1 to 3, operations 300 (see FIG. 3) that may be performed in system 100 will be described. In operation, circuitry 118 may generate, at least in part, and/or transmit, at least in part, to circuitry 118', via one or more networks 50, one or more packets 52 belonging to and/or comprised in, at least in part, one or more flows 142A. One or more packets 52 may comprise data 133. Circuitry 118 may generate, at least in part, data 133 may result from, at least in part, compression of input 126 by circuitry 118.

In this embodiment, input and/or output may be or comprise data, such as, one or more files resident (at least temporarily) in memory 21. Also in this embodiment, compression and/or compressing may comprise one or more operations and/or algorithms comprised in, facilitating, and/or resulting in, at least in part, reduction in size of input data to produce output data, such as, for example, in a manner that may permit at least one portion of the input data to be recovered based at least in part upon the output data. Also in this embodiment, decompression and/or decompressing may comprise one or more operations comprised in, facilitating, and/or resulting in, at least in part, recovery of at least one portion of such input data based at least in part upon such output data. In this embodiment, a portion and/or subset of an entity may comprise some or all of the entity.

In this embodiment, a "packet" may comprise one or more symbols and/or values. Also in this embodiment, a "flow" may comprise a plurality of packets that may share, at least in part, one or more common properties, associations, and/or relationships, such as, for example, one or more common originations, sources, destinations, intended recipients, and/or transmitter/recipient devices of the plurality of packets. Alternatively or additionally, in this embodiment, a flow may involve packets that belong at least in part to the same or similar traffic priority class, protocol type, and/or that may comprise management and/or control packets. Additionally, in this embodiment, a flow may involve packets that comprise one or more similar types of and/or associated data and/or properties, such as, video, audio, multimedia, text, email, attachment, language-specific, and/or geographically-specific data and/or properties. In this embodiment, a job may be, comprise, and/or result from, at least in part, data produced and/or consumed by one or more common processes and/or applications (e.g., one or more processes 180).

For example, in this embodiment, circuitry 118 and/or appliance 10 may generate, at least in part, input 126. Input 126 may comprise, for example, voice-over-IP (VOIP) and/or other data intended to be transmitted to circuitry 118' and/or appliance 20. In operation, circuitry 118 may be capable of compressing, at least in part, input 126 to produce data 133 for transmission to circuitry 118' and/or appliance 20. Circuitry 120 may receive input 126. Circuitry 120 may be capable of performing, at least in part, one or more operations 310 (see FIG. 3) to compress, at least in part, input 126, based at least in part upon one or more sets of statistics 124, to produce output 128. Output 128 may exhibit a certain compression ratio. In this embodiment, a compression ratio may be or comprise a measurement and/or metric indicating, at least in part, a degree and/or amount of compression exhibited by a compressed output relative to an input based upon which the compressed output was generated. If the certain compression ratio exhibited by output 128 is equal to or greater than a predetermined desired compression ratio, then circuitry 118 may supply, as data 133 in one or more packets 52, output 128 to circuitry 118' and/or appliance 20.

Conversely, if the certain compression ratio exhibited by the output 128 is less than the predetermined desired compression ratio, circuitry 122 may be capable of performing, at least in part, one or more operations 311 to further compress, based at least in part upon one or more other sets of statistics 130, the output 128 to produce output 132. Output 132 may exhibit a compression ratio that may be both (1) greater than the certain compression ratio exhibited by output 128 and (2) greater than or equal to the predetermined desired compression ratio. Circuitry 118 may supply, as data 133 in one or more packets 52, output 132 to circuitry 118' and/or appliance 20.

In this embodiment, the predetermined desired compression ratio may be selected, at least in part, by a human user and/or one or more processes 180. For example, the human user may specify and/or indicate, at least in part, the predetermined desired compression ratio via and/or by using, at least in part, the not shown graphical user interface system. The predetermined desired compression ratio may be selected so as to permit data 133 to be sufficiently compressed to permit network bandwidth, transmission, and/or processing parameters to be at least equal to (e.g., equal to or better than) what is desired (e.g., for the type of traffic that comprises and/or embodies the one or more flows 142A and/or jobs 144A), while also permitting the compression-related operations to satisfy desired memory usage, throughput, and latency constraints. Also in this embodiment, output 128, output 132, and/or data 133 may be generated in such a way as to comply or be compatible with the format described in IETF RFC 1951, published May 1996, and/or other and/or later-developed versions of this format, and/or other formats.

In this embodiment, if the compression of input 126 takes place after an initial compression (e.g., an initial iteration of operations 310), one or more sets of statistics 124 may be based, at least in part, upon data 134 that has been previously compressed and that is associated, at least in part, with input 126. Conversely, if the compression of input 126 takes place in such an initial compression, then, for this initial compression, the one or more sets of statistics 124 may be based, at least in part, upon respective predetermined compression encoding information 140A associated, at least in part, with one or more respective flows 142A and/or one or more respective jobs (e.g., one or more jobs 144A in FIG. 2) to which the data 134 may belong. One or more sets of statistics 130 may be based, at least in part, upon input 126. In this embodiment, a statistic may concern, relate to, be associated with, and/or involve, at least in part, one or more characteristics and/or one or more properties, such as, for example, string frequency, distance, and/or other information that may be useful for compression, decompression, and/or Huffman coding. Also in this embodiment, a set may comprise one or more elements.

For example, as illustrated in FIG. 3, as part of operations 310, input 126 may be processed in accordance with, for example, one or more lossless compression algorithms 302. In this embodiment, lossless compression may comprise compression of input to produce output wherein the output includes sufficient information to permit the reproduction of the input. One or more algorithms 302 may be in accordance and/or compatible with, for example, one or more algorithms described in Ziv et al., "A Universal Algorithm for Sequential Data Compression," IEEE Transactions On Information Theory, Vol. IT-23, No. 3, May 1977, pp. 337-343. Of course, one or more algorithms 302 may comprise other and/or additional algorithms without departing from this embodiment. In this embodiment, an algorithm may be or comprise one or more operations. One or more algorithms 302 may generate, at least in part, one or more tokens 162 from input 126. In this embodiment, a token may be or comprise one or more symbols and/or values that may encode and/or be used to replace one or more strings. Also, in this embodiment, one or more strings may comprise one or more sequences of symbols and/or values.

One or more tokens 162 may be provided, in parallel, at least in part, to one or more statistic generation algorithms 306 and/or one or more statistic generation algorithms 312. This may permit, at least in part, one or more algorithms 306 and/or one or more algorithms 312 to be executed in parallel, at least in part. This may result, at least in part, in the generation, at least in part, in parallel, of one or more sets of statistics 124 and one or more sets of statistics 130, based at least in part upon the one or more tokens 162. One or more sets of statistics 124 may be provided to one or more Huffman coding tree generating algorithms 308, in parallel, at least in part, with the provision of one or more statistics 130 to one or more Huffman coding tree generating algorithms 318. This may permit, at least in part, one or more algorithms 308 and/or one or more algorithms 318 to be executed in parallel, at least in part. Thus, in this embodiment, the generation, at least in part, of one or more trees 154 by circuitry 122 may take place in parallel, at least in part, with the compression by the circuitry 120 of input 126 to produce output 128.

One or more algorithms 308 may generate one or more adaptive dynamic Huffman coding trees 160, based at least in part upon one or more sets of statistics 124. One or more algorithms 318 to generate one or more non-adaptive dynamic Huffman coding trees 154, based at least in part upon one or more sets of statistics 130. One or more trees 160 may be for use by one or more Huffman encoding algorithms 304 to compress the output of one or more algorithms 302 to produce output 128. One or more trees 154 may be for use by one or more Huffman encoding algorithms 316 to compress the output of one or more Huffman decoding algorithms 314 to produce output 132. In this embodiment, a Huffman tree may be or comprise coding-related information that may be amenable to representation as and/or in one or more binary trees. Also in this embodiment, an adaptive dynamic Huffman coding may refer to a dynamic Huffman coding that is generated based at least in part upon input to be compressed and other data (e.g., data 134 that has been previously compressed). In this embodiment, a non-adaptive dynamic Huffman coding may refer to a dynamic Huffman coding that is generated at least in part in a manner other than and/or in addition to adaptive dynamic Huffman coding. A non-adaptive dynamic Huffman coding of an input may be (but is not required to be) specifically tuned to optimize compression of the input. In this embodiment, one or more algorithms 308, 304, 318, 316, and/or 314, and/or one or more trees 160 and/or 154 may comply and/or be compatible with teachings disclosed in Huffman, "A Method for the Construction of Minimum-Redundancy Codes," Proceedings of the IRE (Institute of Radio Engineers), September 1952, pp. 1098-1102.

In this embodiment, memory 21 may store respective predetermined compression encoding information 140A . . . 140N associated, at least in part, with respective flows 142A . . . 142N and/or respective jobs 144A . . . 144N (see FIG. 2) that are expected and/or anticipated to be compressed by circuitry 120, 122, and/or 118. Each of the respective encoding information 140A . . . 140N may be associated, at least in part, with one or more of these respective flows 142A . . . 142N and/or one or more of these respective jobs 144A . . . 144N. This may permit one or more processes 180 to be able to select, on a respective anticipated and/or expected flow and/or job basis, respective predetermined compression encoding information to be used by circuitry 120 for an initial compression of input/data associated with a given respective anticipated and/or expected flow and/or job.

For example, input 126 may comprise one or more files and/or other data 201. Input 126 and/or one or more files and/or other data 201 may belong to and/or be associated with, at least in part, one or more respective flows 142A and/or one or more respective jobs 144A. If input 126 and/or data 201 is the first input and/or data belonging to and/or associated with one or more flows 142A and/or one or more jobs 144A, one or more processes 180 may select and/or determine, at least in part, from among flows 142A . . . 142N and/or jobs 144A . . . 144N, (1) the one or more respective flows 142A and/or one or more respective jobs 144A to which input 126 and/or data 201 may belong and/or be associated, and/or (2) the respective predetermined compression encoding information 140A that may be associated, at least in part, with these one or more respective flows 142A and/or one or more respective jobs 144A. For such an initial compression, circuitry 120 may compress input 126 and/or data 201 based at least in part upon the one or more selected flows 142A, one or more selected jobs 144A, and/or the respective associated information 140A.

For example, in this embodiment, respective information 140A may comprise static Huffman coding information 150 and/or one or more pre-computed Huffman trees 152. The coding information 150 and/or one or more trees 152 may be pre-computed based at least in part upon one or more expected characteristics and/or parameters of the input 126, data 201, one or more flows 142A, and/or one or more jobs 144A. Information 140A may be utilized by one or more algorithms 306 and/or 308 and may be pre-computed so as to permit such an initial compression, involving input 126, via operations 310, to produce output 128 in a manner that satisfies, for example, desired efficiency and/or latency parameters. Thus, in this initial compression, one or more sets of statistics 124 may be generated by one or more algorithms based at least in part upon one or more tokens 162 and/or information 140A. Similarly, in this initial compression, one or more trees 160 may be generated by one or more algorithms 308 based at least in part upon one or more sets of statistics 124 and/or information 140A.

After this initial compression, input/data associated with and/or belonging to one or more flows 142A and/or one or more jobs 144A may be compressed by circuitry 120 (e.g., to produce output 128) based at least in part upon that input/data and other data (e.g., data 134) that has previously been compressed by circuitry 120 and that also is associated with and/or belongs to one or more flows 142A and/or one or more jobs 144A. For example, circuitry 118 and/or 120, and/or one or more algorithms 306, may store in memory 21 one or more previously generated sets of statistics associated with input/data 134 that was previously compressed by circuitry 120. If input 126 is being compressed after such an initial compression, one or more algorithms 306 may generate one or more sets of statistics 124 based at least in part upon an aggregation of these one or more previously generated sets of statistics with one or more sets of statistics generated by one or more algorithms 306 based upon the current input 126 being compressed by circuitry 120.

Circuitry 118, 120, and/or 122 may determine and/or compare the compression ratio of output 128 relative to input 126. If this compression ratio is greater than or equal to the desired compression ratio, output 128 may be provided, as data 133, in one or more packets 52.

Conversely, if the compression ratio is less than the desired compression ratio, output 128 may be provided, as part of operations 311, to one or more decoding algorithms 314. One or more decoding algorithms 314 may decompress output 128 and may provide the decompression of output 128 to one or more encoding algorithms 316. One or more algorithms 316 may compress this decompression based at least in part upon one or more non-adaptive trees 154 that may be specifically tuned to provide maximal and/or optimal compression to the specific input 126 based at least in part upon one or more sets of statistics 130 that may reflect only the specific characteristics and/or parameters of input 126 (e.g., in contradistinction to one or more aggregated sets of statistics 124 that may be employed by circuitry 120 in operations 310). This optimal and/or maximal compression may be reflected in output 132 which may be provided, as data 133, in one or more packets 52.

Circuitry 118' may receive one or more packets 52. Circuitry 118' may decompress data 133 to recover, at least in part, one or more portions of input 126 from data 133.

In this embodiment, one or more algorithms 308 may not calculate and/or re-compute one or more trees 160 using and/or based upon a closed loop control decision process and/or based upon compression ratio and/or results. Instead, in this embodiment, recalculation and/or re-computing, if any, of one or more trees 160 may occur as a result, at least in part, of an open loop decision process triggered based at least in part upon passage of a predetermined amount of time and/or compression of a predetermined amount of data since a preceding tree calculation and/or computation.

Thus, an embodiment may include circuitry that first circuitry and second circuitry. The first circuitry may compress, at least in part, based at least in part upon a first set of statistics, input to produce first output exhibiting a first compression ratio. If the first compression ratio is less than a desired compression ratio, the second circuitry may compress, at least in part, based at least in part upon a second set of statistics, the first output to produce second output. The first set of statistics may be based, at least in part, after an initial compression, upon other data that has been previously compressed and is associated, at least in part, with the input. The second set of statistics may be based at least in part upon the input.

Thus, in the embodiment, two parallel compression paths (e.g., comprising operations 310 and 311, respectively) may be employed. Advantageously, for many flows and/or jobs, the compression path that comprises operations 310 may be capable of compressing, with very high speed and low latency, data so as to achieve a desired compression ratio. If, however, the desired compression ratio is not achieved, operations 311 may be advantageously employed, without further user intervention, to compress the data to achieve the desired compression ratio. Advantageously, this may permit the user to be able to dynamically trade-off compression ratio versus compression speed/latency, as selected by and/or on an individual flow and/or job basis. Also, in this embodiment, for an initial compression, respective predetermined compression encoding information may be advantageously employed in operations 310 that is specifically selected based upon and to achieve best results for the specific respective flow and/or job to which the input to be compressed belongs.

Advantageously, this embodiment may be relatively easier and less costly to implement as or in embedded hardware, and/or may exhibit reduced on-chip memory and/or storage requirements. Further advantageously, this embodiment may exhibit improved processing throughput and improved performance. Additionally, in this embodiment, decompression of output 128 and/or 132 may be carried out without pre-programmed the trees and/or identification codes. Advantageously, this may permit this embodiment to be used and/or compatible with currently existing applications.

Many variations, alternatives, and modifications are possible without departing from this embodiment. For example, the respective circuitry that may implement, at least in part, one or more algorithms 308 and/or one or more algorithms 318 may comprise two respective sets of 32-bit counters, for example, to indicate 285 literal symbols and/or 30 distance symbols, and/or to permit on-going frequency count sorting and/or aggregation. Of course, this is merely exemplary and the number, operation, type, and/or construction of such counters and/or circuitry may vary without departing from this embodiment. Many other and/or additional variations, alternatives, and modifications will be apparent to those skilled in the art. The accompanying claims are intended to encompass all such variations, alternatives, and modifications.

What is claimed is:

1. An apparatus comprising:
circuitry that comprises, at least in part, first circuitry and second circuitry, the first circuitry being to compress, at least in part, based at least in part upon a first set of statistics, input to produce first output exhibiting a first compression ratio, the second circuitry being to compress, at least in part, based at least in part upon a second set of statistics, the first output to produce second output, if the first compression ratio is less than a desired compression ratio, the first set of statistics being based, at least in part, after an initial compression, upon other data that has been previously compressed and is associated, at least in part, with the input, the second set of statistics being based at least in part upon the input.

2. The apparatus of claim 1, wherein:
for the initial compression, the first set of statistics is based, at least in part, upon respective predetermined compression encoding information associated, at least in part, with at least one of a respective flow to which the other data belongs and a job to which the other data belongs;
the respective predetermined compression encoding information is selected from a plurality of respective predetermined compression encoding information, based at least in part, upon the at least one of the respective flow and the respective job to which the other data belongs; and
each of the plurality of respective predetermined compression encoding information is associated, at least in part, with one or more of at least one respective flow and at least one respective job.

3. The apparatus of claim 2, wherein:
the respective predetermined compression encoding information that is selected from the plurality of respective predetermined compression encoding information comprises at least one of static coding and a pre-computed tree; and
the second circuitry is to generate, at least in part, one or more non-adaptive dynamic trees for use in Huffman encoding to compress the first output to produce the second output; and
the one or more non-adaptive dynamic trees are to be generated, at least in part, by the second circuitry in parallel, at least in part, with compression by the first circuitry of the input to produce the first output.

4. The apparatus of claim 3, wherein:
the compression by the first circuitry of the input comprises generating, at least in part, one or more adaptive dynamic trees, based at least in part upon the first set of statistics and one or more tokens generated, at least in part, by a lossless compression algorithm.

5. The apparatus of claim 1, wherein:
at least one of the first circuitry and the second circuitry comprises one or more processors to execute one or more instructions, execution of the one or more instructions by the one or more processors resulting in generation, at least in part in parallel, of the first set of statistics and the second set of statistics; and
the execution of the one or more instructions by the one or more processors also results in compression of the input to produce the first output.

6. The apparatus of claim 1, wherein:
an appliance comprises, at least in part, the first circuitry and the second circuitry; and
the first circuitry is to compress the input based at least in part upon at least one of a respective flow to which the input belongs and a respective job to which the input belongs, the respective job being selected, at least in part, by one or more application-level processes, the one or more application-level processes also being capable of selecting the desired compression ratio.

7. The apparatus of claim 1, wherein:
the first circuitry comprises, at least in part, the second circuitry.

8. A method comprising:
compressing, at least in part, by first circuitry, based at least in part upon a first set of statistics, input to produce first output exhibiting a first compression ratio;
if the first compression ratio is less than a desired compression ratio, compressing, at least in part, by second circuitry, based at least in part upon a second set of statistics, the first output to produce second output;
the first set of statistics being based, at least in part, after an initial compression, upon other data that has been previously compressed and is associated, at least in part, with the input; and
the second set of statistics being based at least in part upon the input.

9. The method of claim 8, wherein:
for the initial compression, the first set of statistics is based, at least in part, upon respective predetermined compression encoding information associated, at least in part, with at least one of a respective flow to which the other data belongs and a job to which the other data belongs;
the respective predetermined compression encoding information is selected from a plurality of respective predetermined compression encoding information, based at least in part, upon the at least one of the respective flow and the respective job to which the other data belongs; and
each of the plurality of respective predetermined compression encoding information is associated, at least in part, with one or more of at least one respective flow and at least one respective job.

10. The method of claim 9, wherein:
the respective predetermined compression encoding information that is selected from the plurality of respective predetermined compression encoding information comprises at least one of static coding and a pre-computed tree; and
the second circuitry is to generate, at least in part, one or more non-adaptive dynamic trees for use in Huffman encoding to compress the first output to produce the second output; and
the one or more non-adaptive dynamic trees are to be generated, at least in part, by the second circuitry in parallel, at least in part, with compression by the first circuitry of the input to produce the first output.

11. The method of claim 10, wherein:
the compression by the first circuitry of the input comprises generating, at least in part, one or more adaptive dynamic trees, based at least in part upon the first set of statistics and one or more tokens generated, at least in part, by a lossless compression algorithm.

12. The method of claim 8, wherein:
at least one of the first circuitry and the second circuitry comprises one or more processors to execute one or more instructions, execution of the one or more instructions by the one or more processors resulting in generation, at least in part in parallel, of the first set of statistics and the second set of statistics; and
the execution of the one or more instructions by the one or more processors also results in compression of the input to produce the first output.

13. The method of claim 8, wherein:
an appliance comprises, at least in part, the first circuitry and the second circuitry; and
the first circuitry is to compress the input based at least in part upon at least one of a respective flow to which the input belongs and a respective job to which the input belongs, the respective job being selected, at least in part, by one or more application-level processes, the one or more application-level processes also being capable of selecting the desired compression ratio.

14. Computer-readable memory storing one or more instructions that when executed by a machine result in performance of operations comprising:
compressing, at least in part, by first circuitry, based at least in part upon a first set of statistics, input to produce first output exhibiting a first compression ratio;
if the first compression ratio is less than a desired compression ratio, compressing, at least in part, by second circuitry, based at least in part upon a second set of statistics, the first output to produce second output;
the first set of statistics being based, at least in part, after an initial compression, upon other data that has been previously compressed and is associated, at least in part, with the input; and
the second set of statistics being based at least in part upon the input.

15. The memory of claim 14, wherein:
for the initial compression, the first set of statistics is based, at least in part, upon respective predetermined compression encoding information associated, at least in part, with at least one of a respective flow to which the other data belongs and a job to which the other data belongs;
the respective predetermined compression encoding information is selected from a plurality of respective predetermined compression encoding information, based at least in part, upon the at least one of the respective flow and the respective job to which the other data belongs; and
each of the plurality of respective predetermined compression encoding information is associated, at least in part, with one or more of at least one respective flow and at least one respective job.

16. The memory of claim 15, wherein:
the respective predetermined compression encoding information that is selected from the plurality of respective predetermined compression encoding information comprises at least one of static coding and a pre-computed tree; and
the second circuitry is to generate, at least in part, one or more non-adaptive dynamic trees for use in Huffman encoding to compress the first output to produce the second output; and
the one or more non-adaptive dynamic trees are to be generated, at least in part, by the second circuitry in parallel, at least in part, with compression by the first circuitry of the input to produce the first output.

17. The memory of claim 16, wherein:
the compression by the first circuitry of the input comprises generating, at least in part, one or more adaptive dynamic trees, based at least in part upon the first set of statistics and one or more tokens generated, at least in part, by a lossless compression algorithm.

18. The memory of claim 14, wherein:
at least one of the first circuitry and the second circuitry comprises one or more processors to execute one or more instructions, execution of the one or more instructions by the one or more processors resulting in generation, at least in part in parallel, of the first set of statistics and the second set of statistics; and
the execution of the one or more instructions by the one or more processors also results in compression of the input to produce the first output.

19. The memory of claim 14, wherein:
an appliance comprises, at least in part, the first circuitry and the second circuitry; and
the first circuitry is to compress the input based at least in part upon at least one of a respective flow to which the input belongs and a respective job to which the input belongs, the respective job being selected, at least in part, by one or more application-level processes, the one or more application-level processes also being capable of selecting the desired compression ratio.

20. The memory of claim 14, wherein:
the first circuitry and the second circuitry are the same circuitry, at least in part.

* * * * *